United States Patent
Maekawa et al.

(10) Patent No.: US 10,412,862 B2
(45) Date of Patent: Sep. 10, 2019

(54) AIR COOLING ARRANGMENT FOR A POWER DISTRIBUTOR

(71) Applicant: FUJITSU LIMITED, Kawasaki-shi, Kanagawa (JP)

(72) Inventors: Yoshimi Maekawa, Kawasaki (JP); Yukihiro Hirano, Fucyu (JP); Keita Hirai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/908,867

(22) Filed: Mar. 1, 2018

(65) Prior Publication Data

US 2018/0263141 A1    Sep. 13, 2018

(30) Foreign Application Priority Data

Mar. 8, 2017 (JP) ................................. 2017-043925

(51) Int. Cl.
*H05K 7/20* (2006.01)
*H05K 7/14* (2006.01)

(52) U.S. Cl.
CPC ....... *H05K 7/20909* (2013.01); *H05K 7/1492* (2013.01); *H05K 7/20572* (2013.01); *H05K 7/20736* (2013.01); *H05K 7/20945* (2013.01)

(58) Field of Classification Search
CPC .......... H05K 7/20554–20572; H05K 7/20718; H05K 7/20736; H05K 7/20136; H05K 7/20909; H05K 7/20945; H05K 7/1492
USPC .......................................... 361/695; 454/184
See application file for complete search history.

(56) References Cited

U.S. PATENT DOCUMENTS

| 7,269,009 | B2 * | 9/2007 | Ryu ...................... G06F 1/1601 165/80.1 |
| 2003/0030977 | A1 * | 2/2003 | Garnett ................... G06F 1/183 361/679.48 |
| 2009/0117842 | A1 | 5/2009 | Jie et al. |
| 2014/0185194 | A1 * | 7/2014 | Mills .................... H05K 7/1457 361/624 |

FOREIGN PATENT DOCUMENTS

JP    2009-111300    5/2009

* cited by examiner

*Primary Examiner* — Zachary Pape
(74) *Attorney, Agent, or Firm* — Fujitsu Patent Center (57) ABSTRACT

An information processing apparatus includes a power supply, a fan that causes air to flow into the power supply, and a power distributor that is disposed in front of or in back of the power supply in a direction of flow of the air due to the fan and that is electrically coupled to the power supply, wherein a vent through which the air passes is formed in a surface of the power distributor that faces the power supply.

4 Claims, 10 Drawing Sheets

AIR COOLING ARRANGEMENT FOR A POWER DISTRIBUTOR

CROSS-REFERENCE TO RELATED APPLICATION

This application is based upon and claims the benefit of priority of the prior Japanese Patent Application No. 2017-43925, filed on Mar. 8, 2017, the entire contents of which are incorporated herein by reference.

FIELD

The embodiment discussed herein is related to an information processing apparatus.

BACKGROUND

As an information society has advanced, information processing apparatuses that process a large amount of information at high speed become more important. A rack in such an information processing apparatus accommodates substrates each of which includes electronic components such as a Central Processing Unit (CPU) and a memory mounted thereon, and Power Supply Units (PSUs) that supply electric power to the substrates.

In the rack of the information processing apparatus, power distribution units that distribute electric power to the respective PSUs are disposed. Each power distribution unit includes outlets (plug sockets) in which plugs disposed at ends of power cables of the PSUs are put, and overcurrent protection devices (breakers) that restrain overcurrent from flowing to the respective outlets.

As the performance of the information processing apparatus has improved, the calorific value of the information processing apparatus has increased. When the temperature of the inside of the information processing apparatus exceeds a predetermined allowable upper temperature limit, a problem such as a failure, a malfunction, or a reduction in processing capacity occurs. For this reason, in a typical information processing apparatus, a coolant is circulated through the inside of the rack or air (cold air) is introduced into the rack by using a fan to cool the electronic components.

From the viewpoint of energy savings, the power consumption of the information processing apparatus is preferably decreased. For this reason, it is desirable that the information processing apparatus is more efficiently cooled.

For example, it has been proposed that a duct is disposed on a side of the rack, and air is supplied to the rack from a large number of holes formed in a side surface of the duct to improve cooling efficiency.

An increase in the size of the information processing apparatus enables the cooling efficiency to be relatively easily improved. In this case, however, there is a problem in that a footprint increases.

The following is a reference document.
[Document 1] Japanese Laid-open Patent Publication No. 2009-111300.

SUMMARY

According to an aspect of the invention, an information processing apparatus includes a power supply, a fan that causes air to flow into the power supply, and a power distributor that is disposed in front of or in back of the power supply in a direction of flow of the air due to the fan and that is electrically coupled to the power supply, wherein a vent through which the air passes is formed in a surface of the power distributor that faces the power supply.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Before an embodiment is described, preliminary matters that make the embodiment easy to understand will be described below.

Figure 1A:
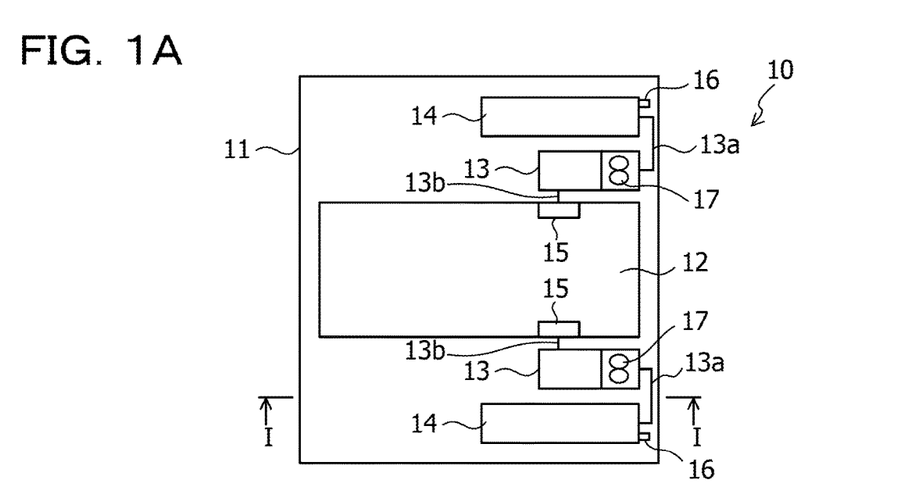
FIG. 1A is a cross-sectional view (schematic view) of an example of an information processing apparatus.
Figure 1B:
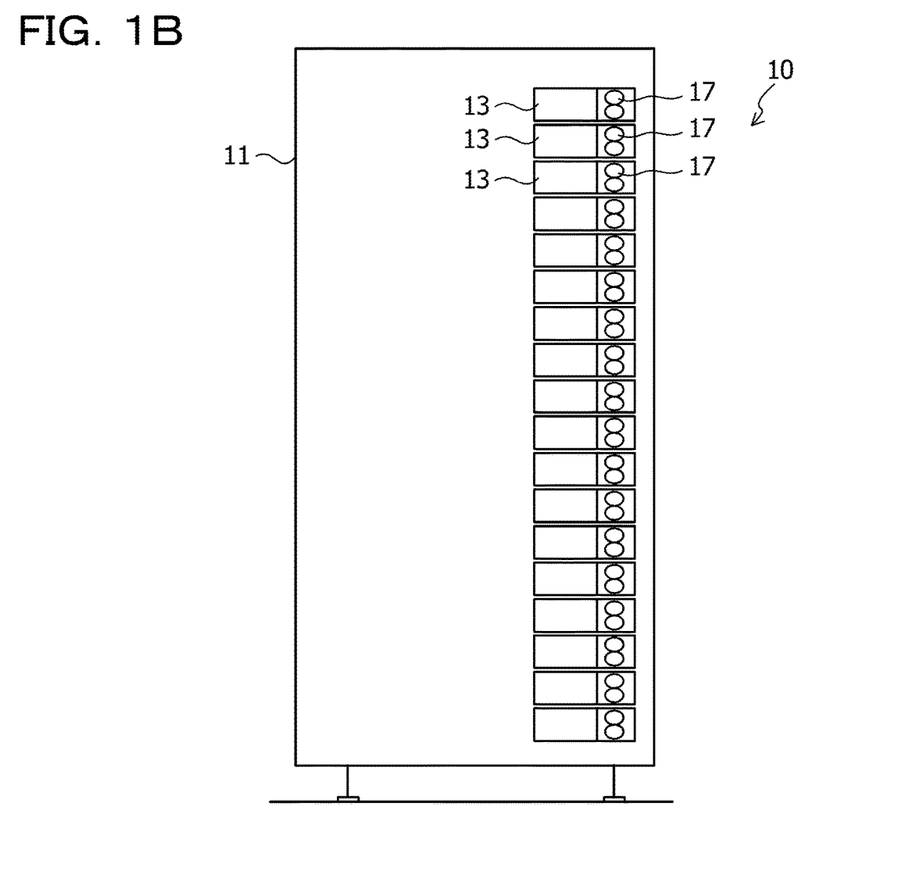
FIG. 1B is a longitudinal sectional view (schematic view) of the information processing apparatus taken along line IB-IB in FIG. 1A.

FIG. 1A is a cross-sectional view (schematic view) of an example of an information processing apparatus. FIG. 1B is a longitudinal sectional view (schematic view) of the information processing apparatus taken along line IB-IB in FIG. 1A.

A rack 11 in an information processing apparatus 10 illustrated in FIGS. 1A and 1B accommodates substrates 12. The substrates 12 are arranged at regular intervals in the height direction. Electronic components (not illustrated) such as a CPU, a memory, and a communication unit are mounted on each substrate 12. The substrates 12 send and receive signals by using the corresponding communication units. The rack 11 is an example of a housing.

PSUs 13 and power distribution units 14 are disposed on both sides of each substrate 12 in the width direction. Each power distribution unit 14 includes outlets (not illustrated) arranged in the height direction. Electric power supplied from an external power source is distributed to the outlets. Plugs disposed at ends of power cables 13a of the PSUs 13 are connected to the corresponding outlets. The PSUs 13 supply electric power to the substrates 12 via power cables 13b and connectors 15.

Each power distribution unit 14 includes overcurrent protection devices (breakers) corresponding to the respective outlets. When overcurrent flows to one of the outlets, the supply of the electric power is stopped. A button included in each overcurrent protection device is designated by reference number 16 in FIG. 1A. When the supply of the electric power is stopped due to overcurrent, the button 16 comes out in the axial direction. When the button 16 is pushed after the cause of the overcurrent is removed, the corresponding overcurrent protection device is restored, and the supply of the electric power is resumed.

The PSUs 13 generate heat depending on the electric power supplied to the substrates 12. The temperature of the inside of each PSU 13 that exceeds a predetermined allowable upper temperature limit is a cause of a failure. For this reason, the information processing apparatus 10 illustrated in FIGS. 1A and 1B includes fans 17 corresponding to the respective PSUs 13 to introduce air (cold air) into the PSUs 13 so that the temperature of the inside of each PSU 13 does not exceed the allowable upper temperature limit. In the information processing apparatus 10 illustrated in FIGS. 1A and 1B, the air moves from the right-hand side to the left-hand side.

In the information processing apparatus 10 illustrated in FIGS. 1A and 1B, the PSUs 13 and the power distribution units 14 are arranged in parallel with respect to the direction of flow of the air (that is, are arranged in the width direction). The reason is that, in the case where the PSUs 13 and the power distribution units 14 are arranged in series with respect to the direction of the flow of the air, the flow of the air through the PSUs 13 is impeded by the power distribution units 14, and the PSUs 13 are not sufficiently cooled.

However, the width of the rack 11 of the information processing apparatus 10 illustrated in FIGS. 1A and 1B is increased, and the information processing apparatus 10 has a large footprint.

An information processing apparatus that enables the power supply units to be efficiently cooled and that has a small footprint will be described below according to the embodiment.

Embodiment

Figure 2A:
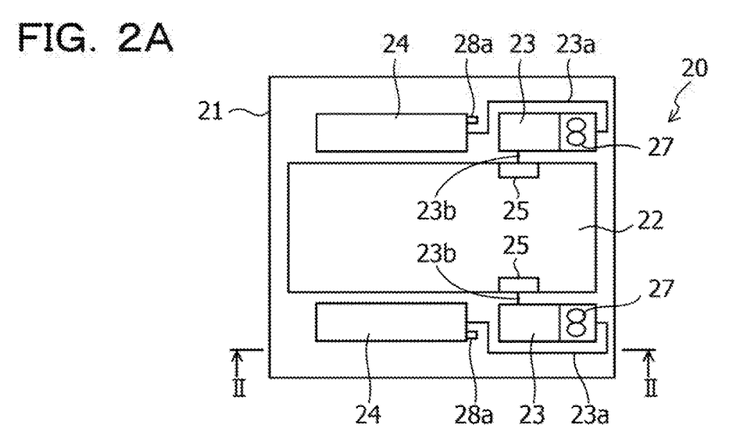
FIG. 2A is a cross-sectional view (schematic view) of an information processing apparatus according to an embodiment.
Figure 2B:
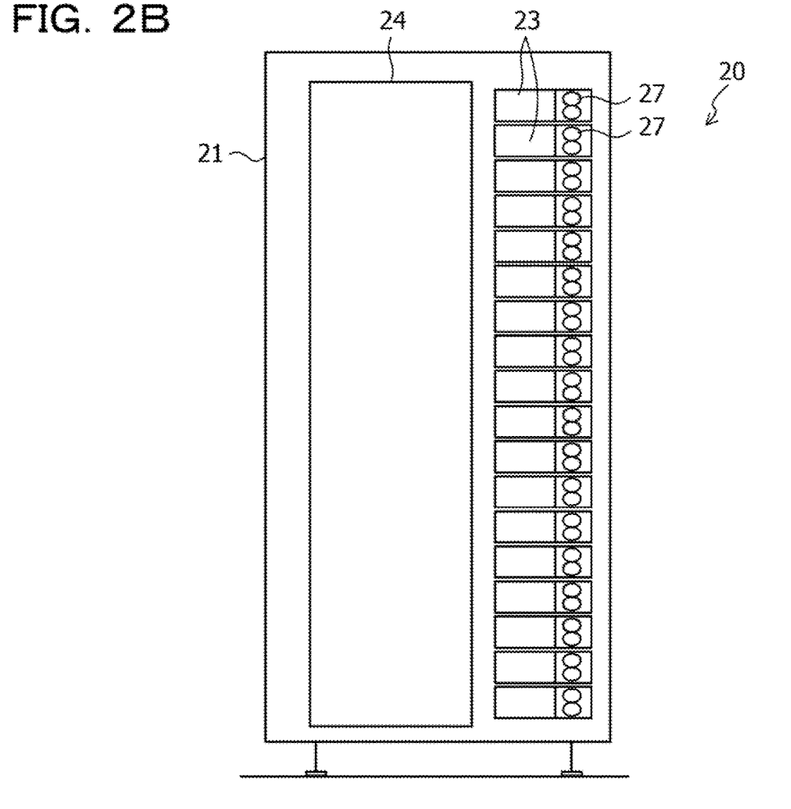
FIG. 2B is a longitudinal sectional view (schematic view) of the information processing apparatus taken along line IIB-IIB in FIG. 2A.
Figure 3:
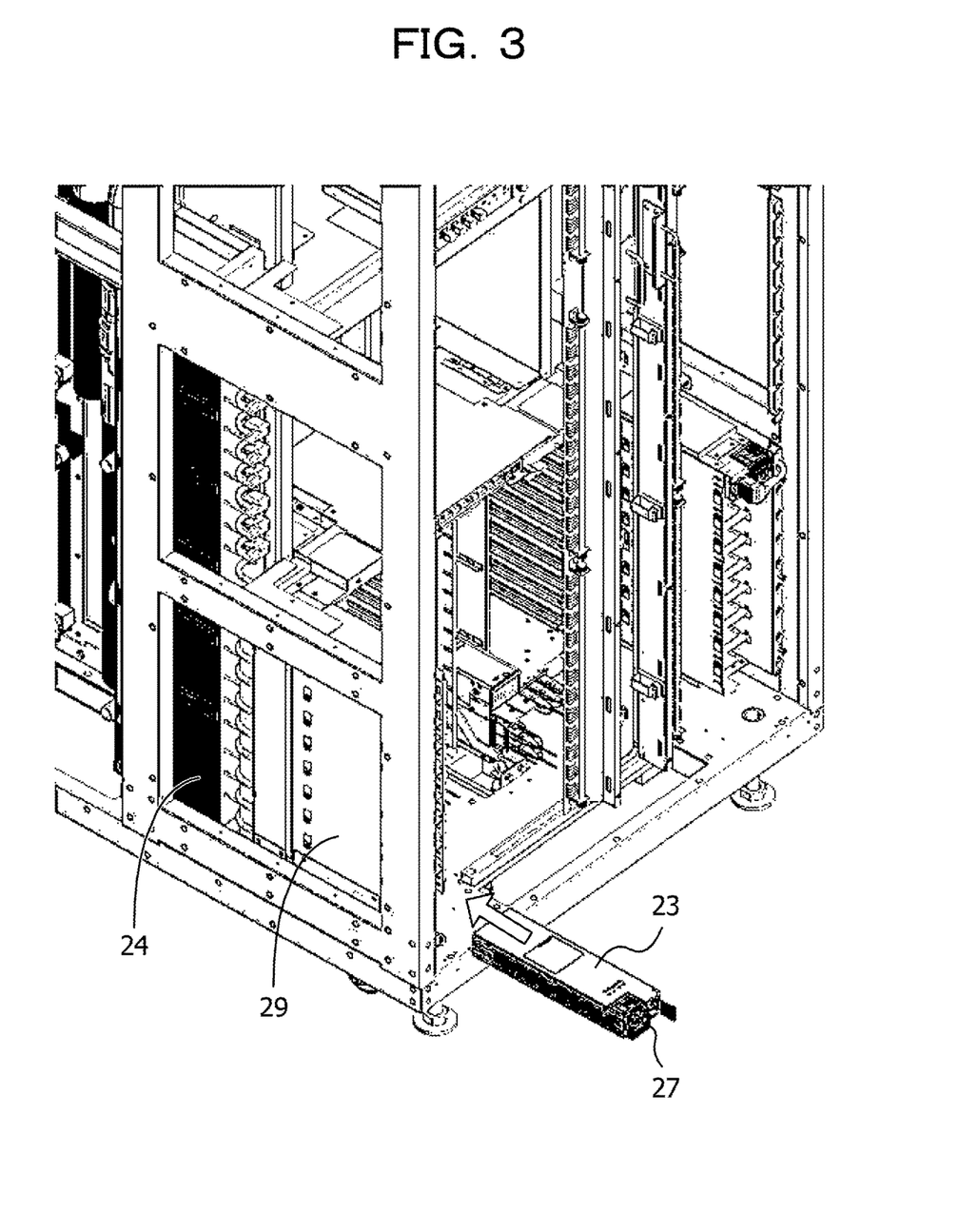
FIG. 3 is a perspective view (schematic view) of the internal structure of the information processing apparatus illustrated in FIGS. 2A and 2B.

FIG. 2A is a cross-sectional view (schematic view) of the information processing apparatus according to the embodiment. FIG. 2B is a longitudinal sectional view (schematic view) of the information processing apparatus taken along line IIB-IIB in FIG. 2A. FIG. 3 is a perspective view (schematic view) of the internal structure of this information processing apparatus.

As illustrated in FIGS. 2A and 2B, an information processing apparatus 20 according to the embodiment includes a rack 21, substrates 22 accommodated in the rack 21, PSUs (power supply units) 23 that are disposed on both sides of each substrate 22 in the width direction, and power distribution units 24 that are disposed on both sides of each substrate 22 in the width direction.

In the following description, the right-hand side of the rack 21 in FIGS. 2A and 2B is referred to as a front side, and the left-hand side thereof is referred to as a back side for convenience of description.

The substrates 22 are arranged at regular intervals in the height direction. Electronic components (not illustrated) such as a CPU, a memory, and a communication unit are mounted on each substrate 22. The substrates 22 send and receive signals by using the corresponding communication units.

The PSUs 23 are disposed on the front surface side of the rack 21 and supply electric power to the substrates 22 via power cables 23b and connectors 25. The PSUs 23 include respective fans 27 that cause air to flow into the PSUs 23. According to the embodiment, the fans 27 move the air from the front surface side (right-hand side in FIG. 2A) to the back surface side (left-hand side in FIG. 2A) of the rack 21. As illustrated in FIG. 3, each PSU 23 is inserted in a case 29 disposed in the rack 21.

Figure 4A:
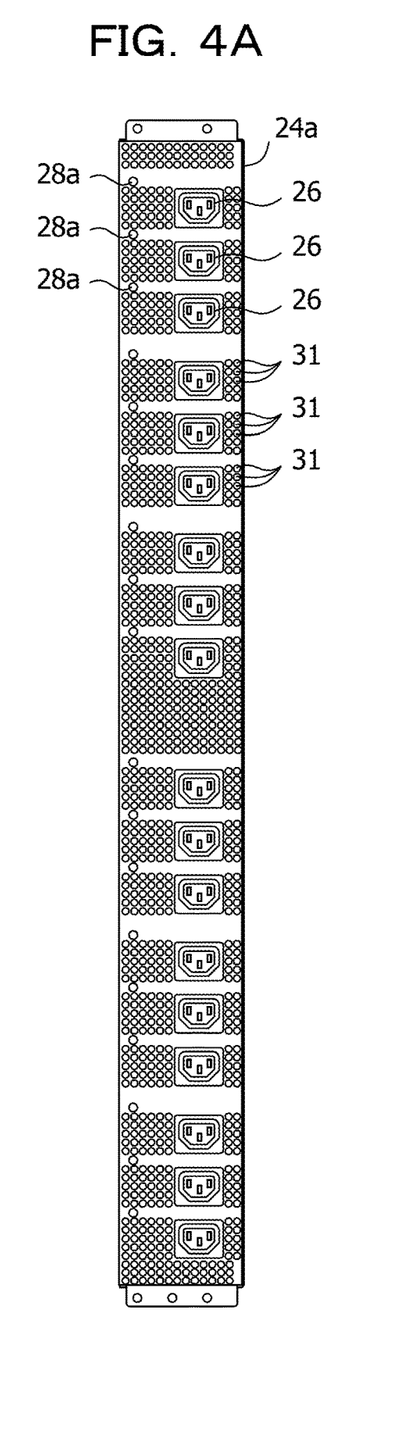
FIG. 4A is a plan view of a power distribution unit viewed from a front surface side.
Figure 4B:
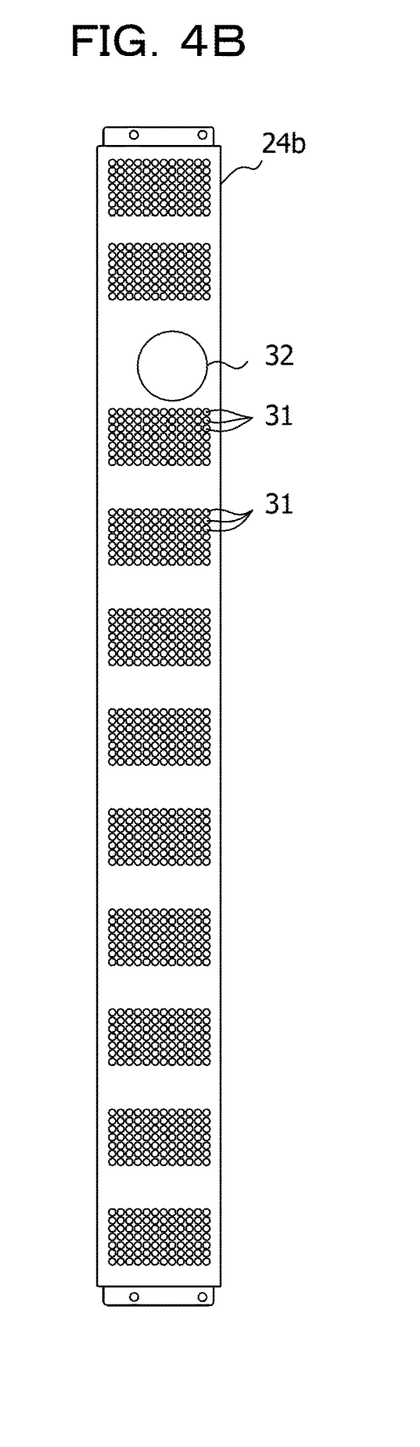
FIG. 4B is a plan view of the power distribution unit viewed from a back surface side.
Figure 5:
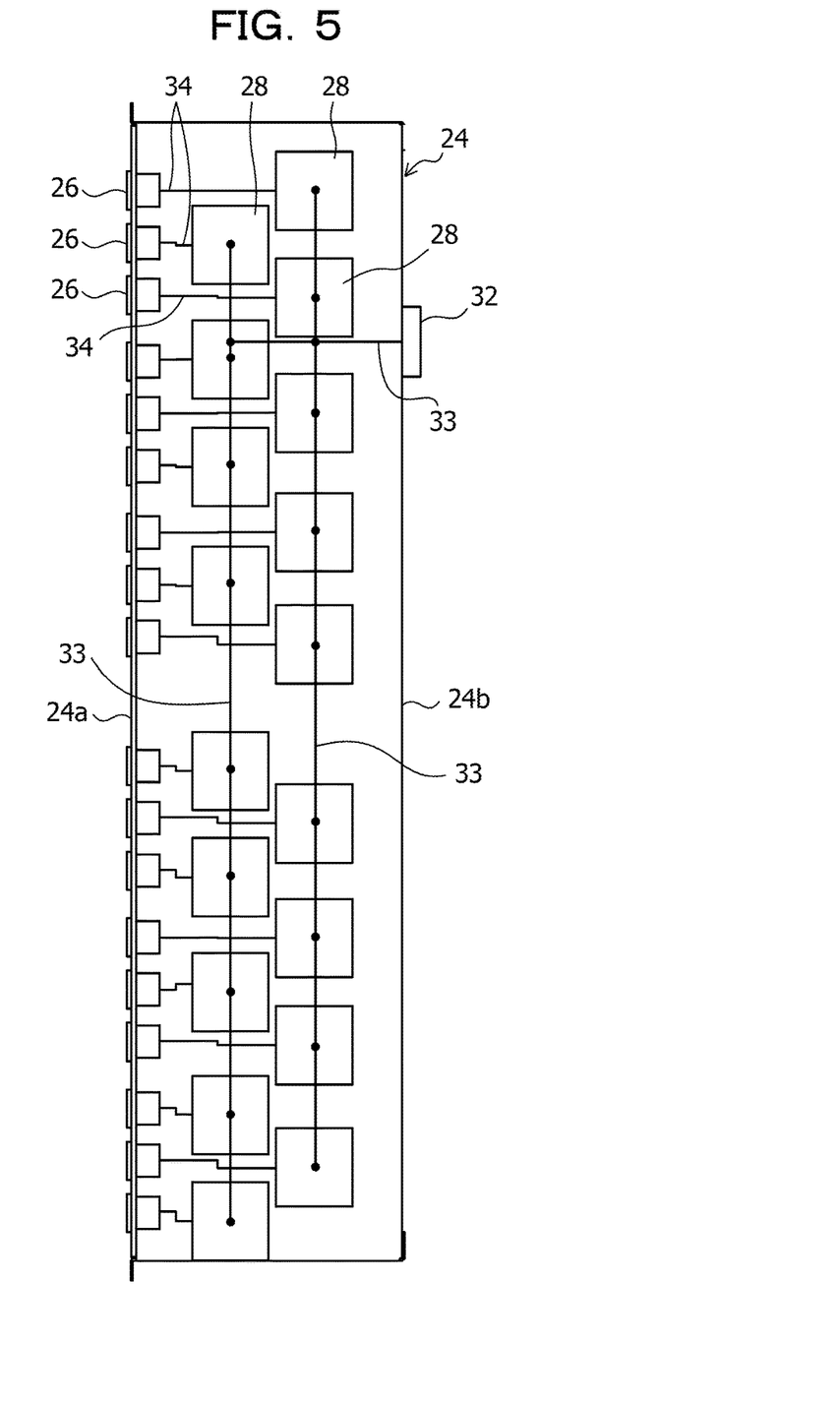
FIG. 5 is a schematic view of the internal structure of the power distribution unit.
Figure 6:
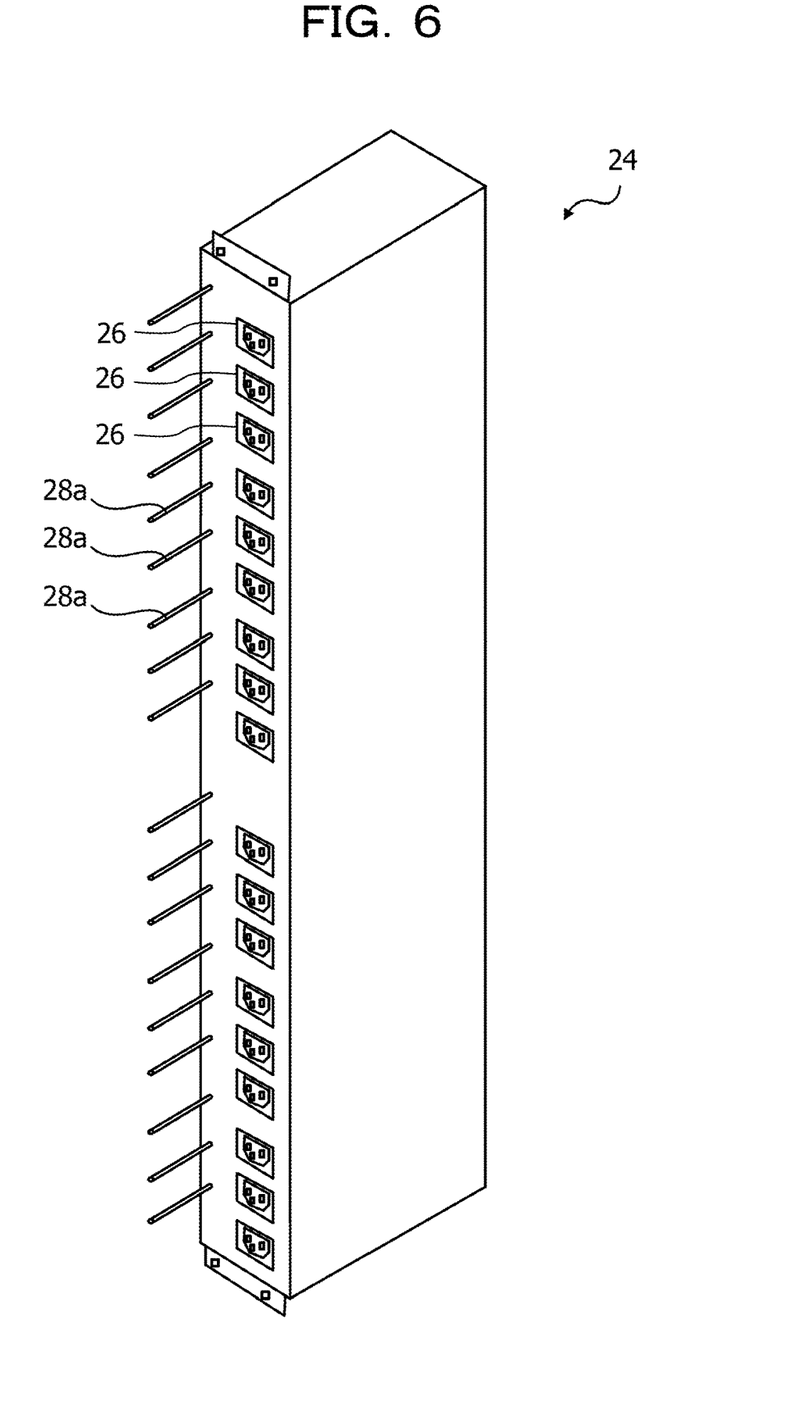
FIG. 6 is a perspective view of the power distribution unit.

The power distribution units 24 are disposed in back of the respective PSUs 23. FIG. 4A is a plan view of one of the power distribution units 24 viewed from the front surface side. FIG. 4B is a plan view of the power distribution unit 24 viewed from the back surface side. FIG. 5 is a schematic view of the internal structure of the power distribution unit 24. FIG. 6 is a perspective view of the power distribution unit 24.

As illustrated in FIG. 4A and FIG. 6, a front panel 24a of each power distribution unit 24 includes outlets 26 arranged in the height direction. Plugs (not illustrated) that are disposed at ends of power cables 23a (see FIG. 2A) of the PSUs 23 are connected to the corresponding outlets 26 so as to be extractable. As illustrated in FIG. 4B, a connector 32 is disposed on a back panel 24b of each power distribution unit 24. A power cable connected to an external power source (not illustrated) is connected to each connector 32.

As illustrated in FIGS. 4A and 4B, a large number of vents 31 are formed in the front panel 24a and the back panel 24b of each power distribution unit 24. Air discharged from each PSU 23 thus enters the corresponding power distribution unit 24 from the vents 31 of the front panel 24a of the power distribution unit 24, passes through the power distribution unit 24, and is discharged from the vents 31 of the back panel 24b. In FIG. 6, an illustration of the vents 31 is omitted.

As illustrated in FIG. 5, overcurrent protection devices 28 corresponding to the respective outlets 26 are disposed in each power distribution unit 24. The overcurrent protection devices 28 are connected to the corresponding connector 32 with cables 33 interposed therebetween. The outlets 26 are connected to the respective overcurrent protection devices 28 with cables 34 interposed therebetween, and electric power is supplied thereto from the overcurrent protection devices 28.

A button included in each overcurrent protection device 28 is designated by reference number 28a in FIG. 2A, FIG. 4A, and FIG. 6. When one of the overcurrent protection devices 28 operates due to overcurrent to stop the supply of the electric power to the corresponding outlet 26, the button 28a comes out in the axial direction. When the button 28a is pushed after the cause of the overcurrent is removed, the overcurrent protection device 28 is restored, and the supply of the electric power is started.

As illustrated in FIGS. 2A and 2B, in the information processing apparatus 20 according to the embodiment, the power distribution units 24 are disposed in back of the respective PSUs 23 in the direction of the flow of the air (that is, in series with respect to the direction of the flow of the air). As illustrated in FIGS. 4A and 4B, in the information processing apparatus 20 according to the embodiment, a large number of the vents 31 are formed in the front panel 24a and the back panel 24b of each power distribution unit 24.

Air discharged from each PSU 23 thus enters the corresponding power distribution unit 24 via the vents 31 of the front panel 24a and is discharged from the vents 31 of the back panel 24b. Accordingly, the flow of the air through the PSUs 23 is not impeded by the power distribution units 24, and the PSUs 23 are sufficiently cooled.

In the information processing apparatus 20 according to the embodiment, the PSUs 23 and the power distribution units 24 are arranged in series with respect to the direction of the flow of the air, and thus, the width of the rack is less than that in the information processing apparatus 10 illustrated in FIGS. 1A and 1B. Consequently, the footprint of the information processing apparatus 20 is decreased.

Figure 7A:
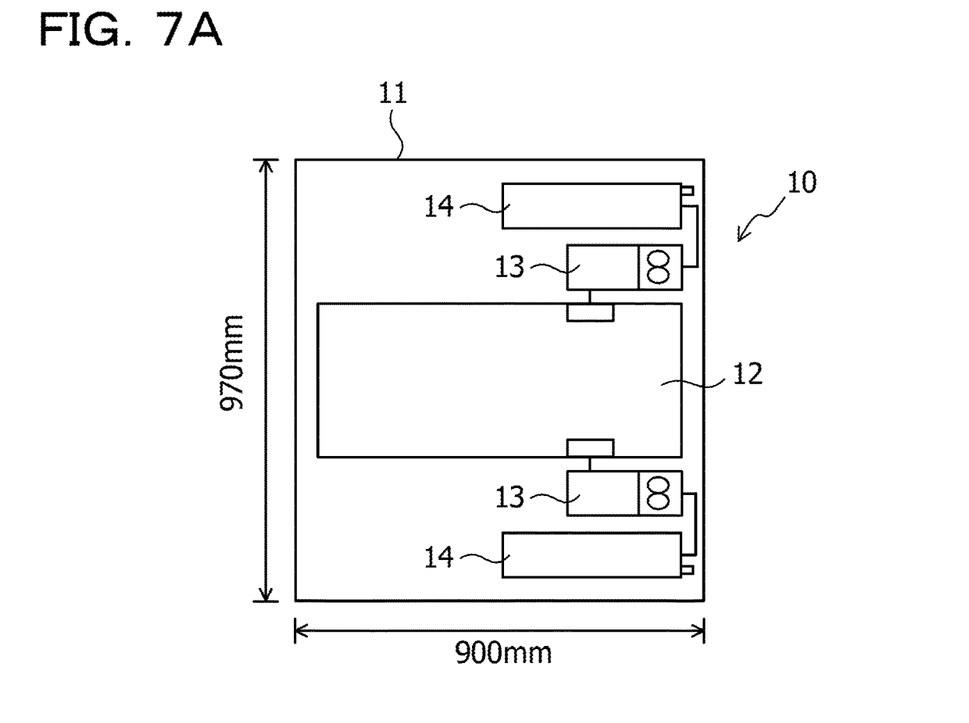
FIG. 7A illustrates the size of the information processing apparatus illustrated in FIGS. 1A and 1B.
Figure 7B:
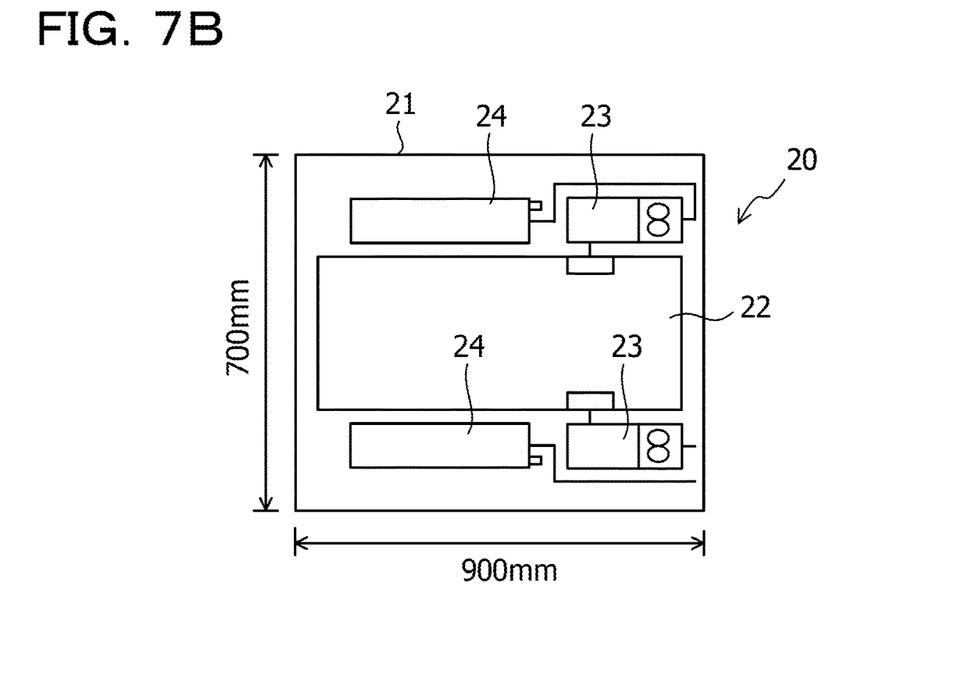
FIG. 7B illustrates the size of the information processing apparatus illustrated in FIGS. 2A and 2B.

FIG. 7A illustrates the size of the information processing apparatus 10 illustrated in FIGS. 1A and 1B. FIG. 7B illustrates the size of the information processing apparatus 20 illustrated in FIGS. 2A and 2B. Here, the sizes of the substrates 12, the PSUs 13, and the power distribution units 14 illustrated in FIG. 7A are equal to the sizes of the substrates 22, the PSUs 23, and the power distribution units 24 illustrated in FIG. 7B.

In the case of the information processing apparatus 10 illustrated in FIGS. 1A and 1B, in which the PSUs 13 and the power distribution units 14 are arranged in parallel with respect to the direction of the flow of the air, for example, the width of the rack 11 is 970 mm, and the length thereof is 900 mm as illustrated in FIG. 7A.

In the case of the information processing apparatus 20 according to the embodiment, in which the PSUs 23 and the power distribution units 24 are arranged in series with respect to the direction of the flow of the air, for example, the width of the rack 21 is 700 mm, and the length thereof is 900 mm as illustrated in FIG. 7B. The footprint of the information processing apparatus 20 according to the embodiment is thus smaller than that of the information processing apparatus 10 illustrated in FIGS. 1A and 1B.

When overcurrent flows to one of the PSUs 23 for some reason, the corresponding overcurrent protection device 28 operates to stop the supply of the electric power. The button 28a of the overcurrent protection device 28 is pushed to resume the supply of the electric power. In this case, the PSU 23 is pulled out of the case 29 (see FIG. 3) to expose the front panel 24a of the corresponding power distribution unit 24, and the button 28a is pushed by using a rod tool to resume the supply of the electric power.

The aperture ratio of the front panel 24a and the back panel 24b of each power distribution unit 24 will be now described. The aperture ratio is a ratio ((Sh/Sa)×100%) of the total area Sh of the vents 31 of the front panel 24a or the back panel 24b to the area Sa of the front panel 24a or the back panel 24b.

It is preferable that the size of each vent 31 formed in the front panel 24a and the back panel 24b be increased, and the number of the vents 31 be increased to facilitate the flow of the air through the power distribution units 24. That is, in consideration for the cooling efficiency, the aperture ratio of the front panel 24a and the back panel 24b is preferably increased.

However, the increase in the aperture ratio of the front panel 24a and the back panel 24b decreases the strength of the front panel 24a and the back panel 24b. In general, the thickness of a metal plate used as a panel of this kind of power distribution unit is about 0.8 mm to 1 mm. In the case where the aperture ratio is more than 50%, it is difficult to maintain a sufficient strength thereof. For example, in the case where the aperture ratio of the front panel 24a is more than 50%, it may be thought that the front panel 24a bends when the plug is connected to the outlet 26. For this reason, the aperture ratio of the front panel 24a and the back panel 24b is preferably 50% or less.

In the case where the aperture ratio of the front panel 24a and the back panel 24b is too small, the amount of the air flowing through the PSUs 23 is restricted by the power distribution units 24, the temperature of each PSU 23 exceeds the allowable upper temperature limit.

Figure 8:
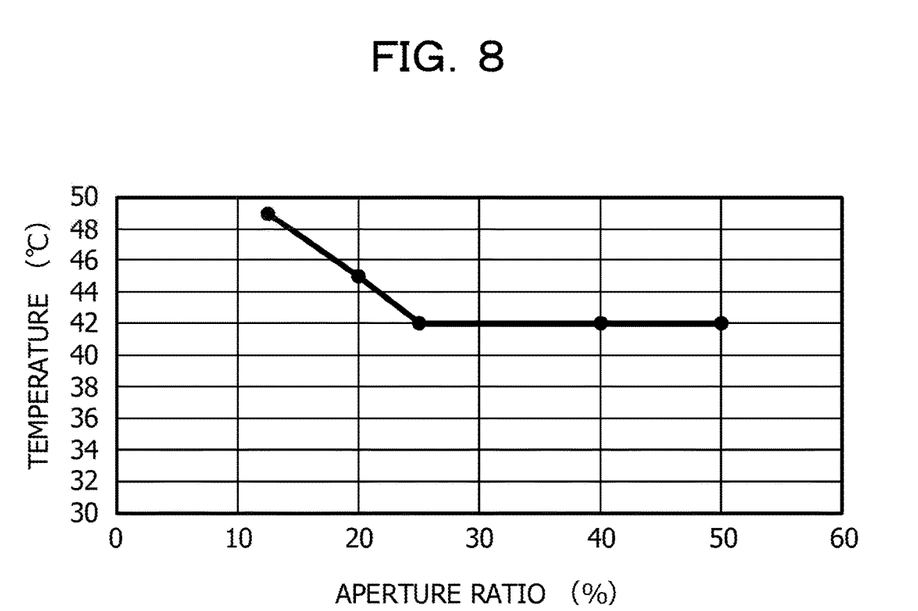
FIG. 8 illustrates the result of a simulation of the relationship between an aperture ratio and the temperature of air discharged from a PSU.

FIG. 8 illustrates the result of a simulation of the relationship between the aperture ratio and the temperature of the air discharged from the PSUs 23, in which the horizontal axis represents the aperture ratio and the vertical axis represents the temperature. In this simulation, the output of each PSU 23 is 1600 W, and the temperature in the case where the PSUs 23 and the power distribution units 24 are arranged in series with respect to the direction of the flow of the air as illustrated in FIG. 2A is investigated.

The size of each PSU 23 is 73.5 mm in width, 40 mm in height, and 272.5 mm in length (depth). The allowable upper temperature limit of each PSU 23 that is specified is 45° C. The width of each power distribution unit 24 is equal to the width of each PSU 23.

It may be understood from FIG. 8 that, in the case where the aperture ratio of the front panel 24a and the back panel 24b of each power distribution unit 24 is 20%, the temperature of the air discharged from the PSUs 23 is an allowable upper temperature limit of 45° C., and in the case where the aperture ratio is less than 20%, the temperature exceeds the allowable upper temperature limit. It may be also understood from FIG. 8 that, in the case where the aperture ratio of the front panel 24a and the back panel 24b of each power distribution unit 24 is 25% or more, the temperature of the air discharged from the PSUs 23 does not substantially change (about 42° C.).

Accordingly, the aperture ratio of the front panel 24a and the back panel 24b of each power distribution unit 24 is preferably no less than 20% (more preferably, no less than 25%) and no more than 50%.

First Modification

Figure 9A:
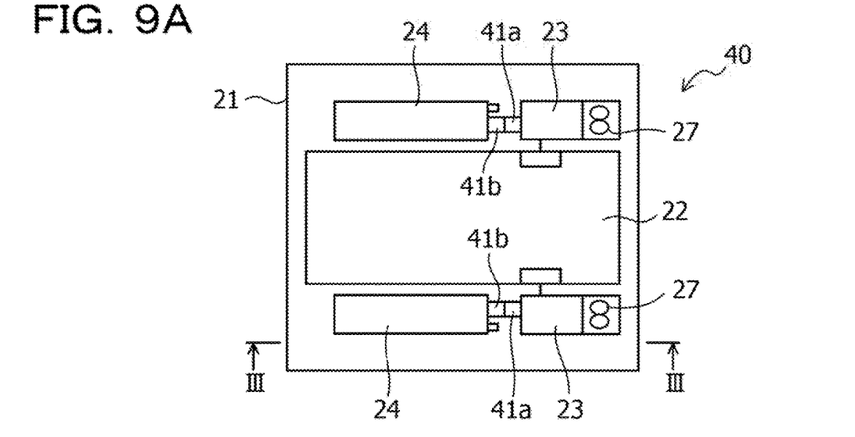
FIG. 9A is a cross-sectional view (schematic view) of an information processing apparatus according to a first modification.
Figure 9B:
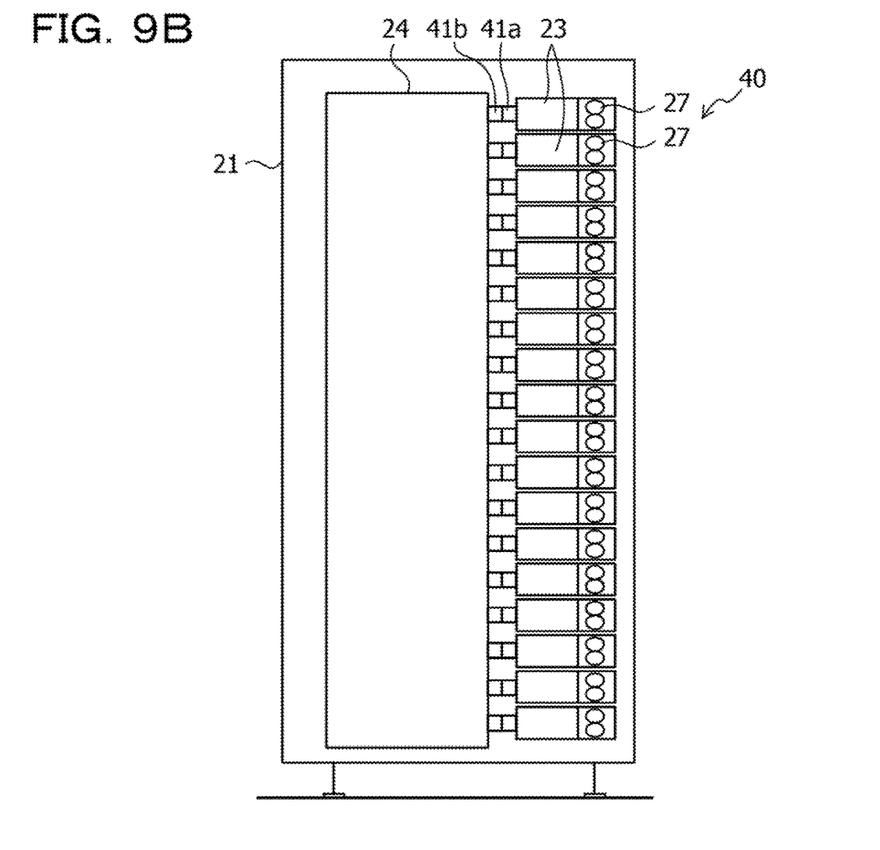
FIG. 9B is a longitudinal sectional view (schematic view) of the information processing apparatus taken along line IXB-IXB in FIG. 9A.

FIG. 9A is a cross-sectional view (schematic view) of an information processing apparatus according to a first modification. FIG. 9B is a longitudinal sectional view (schematic view) of the information processing apparatus taken along line IXB-IXB in FIG. 9A. In FIGS. 9A and 9B, components like to those in FIGS. 2A and 2B are designated by like reference numbers, and a detailed description thereof is omitted.

In the information processing apparatus 20 illustrated in FIGS. 2A and 2B, the PSUs 23 and the power distribution units 24 are connected to each other by using the power cables 23a. In an information processing apparatus 40 according to the first modification, the PSUs 23 and the power distribution units 24 are electrically connected to each other by using connectors 41a and 41b.

The connectors 41a are, for example, female connectors that the PSUs 23 include. The connectors 41b are, for example, male connectors that the power distribution units 24 include. When the PSUs 23 are inserted in the case 29 (see FIG. 3) of the rack 21, the connectors 41a and the connectors 41b engage each other, and the PSUs 23 and the power distribution units 24 are electrically connected to each other. When the PSUs 23 are pulled out of the case 29 (see FIG. 3), the connectors 41a and the connectors 41b are mechanically separated from each other, and the PSUs 23 and the power distribution units 24 are electrically separated from each other.

Also in the information processing apparatus 40 illustrated in FIGS. 9A and 9B, a large number of the vents 31 are formed in the front panel 24a and the back panel 24b of each power distribution unit 24 (see FIGS. 4A and 4B). The PSUs 23 and the power distribution units 24 are arranged in series with respect to the direction of the flow of the air. Thus, the PSUs 23 may be sufficiently cooled, and the footprint may be decreased as in the case of the information processing apparatus 20 illustrated in FIGS. 2A and 2B.

Second Modification

Figure 10A:
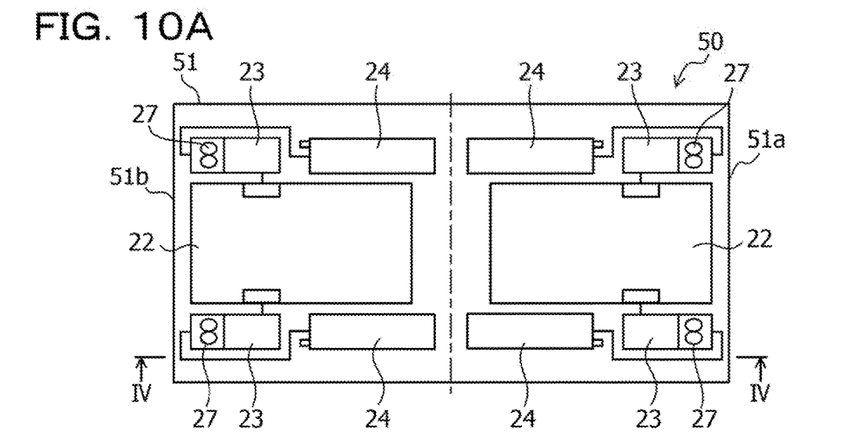
FIG. 10A is a cross-sectional view (schematic view) of an information processing apparatus according to a second modification.
Figure 10B:
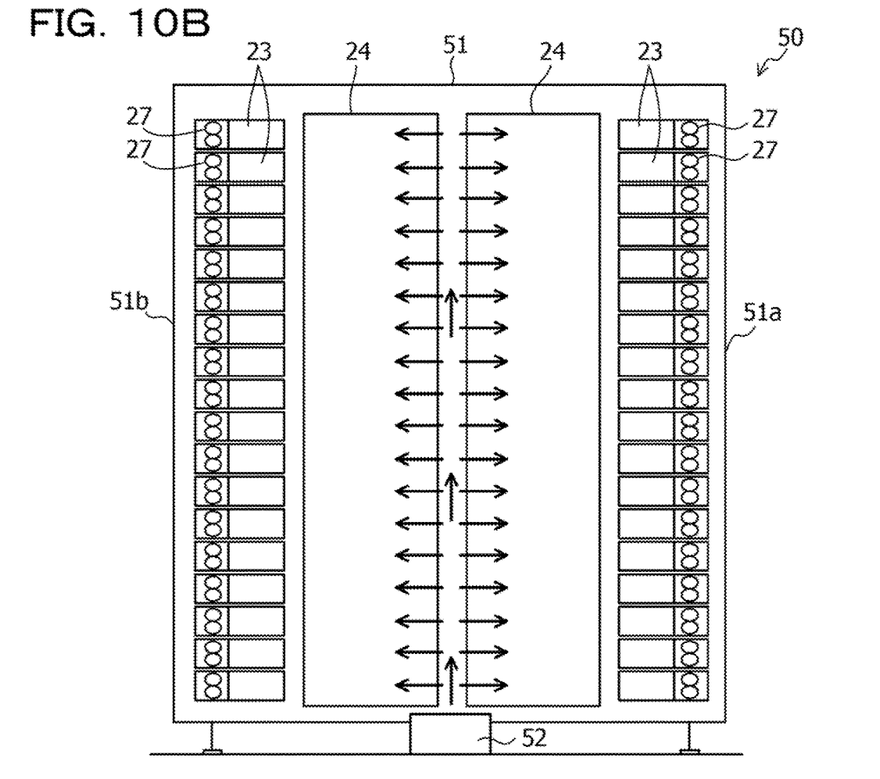
FIG. 10B is a longitudinal sectional view (schematic view) of the information processing apparatus taken along line XB-XB in FIG. 10A.

FIG. 10A is a cross-sectional view (schematic view) of an information processing apparatus according to a second modification. FIG. 10B is a longitudinal sectional view (schematic view) of the information processing apparatus taken along line XB-XB in FIG. 10A. In FIGS. 10A and 10B, components like to those in FIGS. 2A and 2B are designated by like reference numbers, and a detailed description thereof is omitted.

As illustrated in FIG. 10A, in an information processing apparatus 50 according to the second modification, the substrates 22 are arranged at regular intervals in the height direction at positions symmetrical to each other with respect to a symmetry axis along a central line (one-dot chain line in FIG. 10A) of a rack 51 in the length direction. The PSUs 23 and the power distribution units 24 are disposed on both sides of each substrate 22 in the width direction.

In the following description, the surface of the rack 51 on the right-hand side in FIGS. 10A and 10B is referred to as a first surface 51a, and the surface thereof on the left-hand side is referred to as a second surface 51b for convenience of description. The substrates 22 near the first surface 51a may be pulled out across the first surface 51a for maintenance. The substrates 22 near the second surface 51b may be pulled out across the second surface 51b for maintenance.

In the description, regarding the PSUs 23 and the power distribution units 24 located on the right-hand side of the central line of the rack 51, the surfaces thereof facing the first surface 51a (surfaces on the right-hand side) are referred to as front surfaces, and the opposite surfaces (surfaces on the left-hand side) are referred to as back surfaces. Regarding the PSUs 23 and the power distribution units 24 located on the left-hand side of the central line of the rack 51, the surfaces thereof facing the second surface 51b (surfaces on the left-hand side) are referred to as front surfaces, and the opposite surfaces (surfaces on the right-hand side) are referred to as back surfaces.

Also according to the second modification, a large number of the vents 31 are formed in the front panel 24a and the back panel 24b of each power distribution unit 24 (see FIGS. 4A and 4B). An intake 52 is disposed at the center of the bottom surface of the rack 51.

The PSUs 23 include the respective fans 27. The fans 27 create flow of air such that the air enters the rack 51 from the intake 52, moves upward from below in the rack 51, passes through the power distribution units 24 from the back panel 24b to the front panel 24a, passes through the PSUs 23, and is discharged from the rack 51 to the outside.

Also in the information processing apparatus 50 according to the second modification, a large number of the vents 31 are formed in the front panel 24a and the back panel 24b of each power distribution unit 24 as described above. The PSUs 23 and the power distribution units 24 are arranged in series with respect to the direction of the flow of the air.

Thus, in the information processing apparatus 50 according to the second modification, the PSUs 23 are sufficiently cooled, and the footprint is decreased as in the case of the information processing apparatus 20 illustrated in FIGS. 2A and 2B.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing apparatus comprising:
a power supply;
a fan that causes air to flow into the power supply; and
a power distributor that is disposed in front of or in back of the power supply in a direction of flow of the air due to the fan and that is electrically coupled to the power supply, the power distributer includes
a connector that is disposed on a back panel of the power distributer,
a plurality of outlets that are disposed on a front panel of the power distributer,
a plurality of overcurrent protection devices that are coupled to the corresponding outlet and the connector, and
a plurality of vents through which the air passes are formed in the back panel and the front panel of the power distributor, and
the power distributer distributes AC power from the power supply to the plurality of outlets.

2. The information processing apparatus according to claim 1, further comprising:
a housing that accommodates the power supply and the power distributor; and
a plurality of substrates each of which includes an electronic component mounted thereon and is supplied with electric power from the power supply, the substrates being arranged in the housing at regular intervals in a height direction.

3. The information processing apparatus according to claim 1, wherein the power supply and the power distributor are electrically coupled to each other with a connector interposed therebetween.

4. The information processing apparatus according to claim 1, wherein an aperture ratio of the surface of the power distributor that faces the power supply is no less than 20% and no more than 50%.

* * * * *